(12) United States Patent
La Paglia et al.

(10) Patent No.: US 9,839,152 B2
(45) Date of Patent: Dec. 5, 2017

(54) CONTROL PANEL

(75) Inventors: Anthony La Paglia, Illkirch (FR); Frederic Prigent, Illkirch (FR)

(73) Assignee: DELPHI TECHNOLOGIES, INC., Troy, MI (US)

( * ) Notice: Subject to any disclaimer, the term of this patent is extended or adjusted under 35 U.S.C. 154(b) by 672 days.

(21) Appl. No.: 14/002,777

(22) PCT Filed: Mar. 1, 2012

(86) PCT No.: PCT/EP2012/053526
§ 371 (c)(1),
(2), (4) Date: Sep. 3, 2013

(87) PCT Pub. No.: WO2012/126706
PCT Pub. Date: Sep. 27, 2012

(65) Prior Publication Data
US 2013/0343026 A1  Dec. 26, 2013

(30) Foreign Application Priority Data

Mar. 21, 2011 (FR) ..................................... 11 52285

(51) Int. Cl.
*H05K 7/02* (2006.01)
*H01H 13/86* (2006.01)
(Continued)

(52) U.S. Cl.
CPC ............... *H05K 7/02* (2013.01); *B60K 37/06* (2013.01); *H01H 13/705* (2013.01);
(Continued)

(58) Field of Classification Search
CPC .... H05K 7/02; B60K 37/06; B60K 2350/925; H01H 13/705; H01H 13/86;
(Continued)

(56) References Cited

U.S. PATENT DOCUMENTS 4,531,033 A * 7/1985 Schmid et al. ................ 200/314
5,421,659 A * 6/1995 Liang ............................ 400/472
(Continued)

FOREIGN PATENT DOCUMENTS

GB       2 327 908 A    2/1999

OTHER PUBLICATIONS

International Search Report dated Apr. 18, 2012.

Primary Examiner — David M Sinclair
Assistant Examiner — Theron S Milliser
(74) Attorney, Agent, or Firm — Lawrence D. Hazelton

(57) ABSTRACT

A control panel designed to be placed in a vertical plane, the control panel comprising the layered assembly of a flat base, of an elastomer sheet mounted against the base, the sheet being provided with openings and optionally with domes, and of a decorative fascia. The control panel is in addition provided with a means for protection against liquids made in one piece with the sheet, the protection means comprising elements projecting from the main surface of the sheet, the said elements being so arranged that when the control panel is in the substantially vertical plane and the liquid penetrates between the sheet and the decorative fascia, the liquid is guided along a determined course and re-emerges from the panel having avoided critical zones leading in particular to detectors.

10 Claims, 6 Drawing Sheets

(51) Int. Cl.
*H01H 13/705* (2006.01)
*B60K 37/06* (2006.01)
*H01H 13/06* (2006.01)

(52) U.S. Cl.
CPC ....... *H01H 13/86* (2013.01); *B60K 2350/925* (2013.01); *H01H 13/06* (2013.01); *H01H 2221/026* (2013.01); *H01H 2223/002* (2013.01); *H01H 2223/004* (2013.01); *H01H 2231/026* (2013.01)

(58) Field of Classification Search
CPC ....... H01H 2223/002; H01H 2223/004; H01H 2231/026; H01H 2221/026; H01H 13/06
See application file for complete search history.

(56) References Cited

U.S. PATENT DOCUMENTS

| | | | |
|---|---|---|---|
| 5,504,661 A * | 4/1996 | Szpak | 362/23.19 |
| 5,739,486 A * | 4/1998 | Buckingham | 200/5 A |
| 5,810,491 A * | 9/1998 | Muller et al. | 400/496 |
| 5,892,192 A * | 4/1999 | Ishiguro et al. | 200/5 R |
| 6,054,939 A * | 4/2000 | Wei et al. | 341/20 |
| 6,215,420 B1 * | 4/2001 | Harrison et al. | 341/22 |
| 6,354,210 B1 * | 3/2002 | Chao | 101/472 |
| 6,394,619 B1 * | 5/2002 | Snider | 362/23.04 |
| 6,443,644 B1 * | 9/2002 | Takeda et al. | 400/490 |
| 6,542,355 B1 * | 4/2003 | Huang | 361/679.08 |
| 6,610,944 B2 * | 8/2003 | Lee et al. | 200/302.1 |
| 7,012,206 B2 * | 3/2006 | Oikawa | 200/302.1 |
| 7,173,204 B2 * | 2/2007 | Schmidt et al. | 200/310 |
| 7,230,195 B2 * | 6/2007 | Ohnishi | 200/302.1 |
| 7,365,281 B2 * | 4/2008 | Yamaguchi et al. | 200/302.1 |
| 8,232,493 B2 * | 7/2012 | Ichikawa et al. | 200/341 |
| 8,426,755 B2 * | 4/2013 | Nogami | 200/302.1 |
| 8,824,162 B2 * | 9/2014 | Alvarez et al. | 361/765 |
| 2003/0222800 A1 * | 12/2003 | Uke | 341/22 |
| 2008/0094232 A1 * | 4/2008 | Yokote | 340/604 |
| 2009/0154133 A1 * | 6/2009 | Choi | 361/812 |

* cited by examiner

CONTROL PANEL

CROSS-REFERENCE TO RELATED APPLICATION

This application claims the benefit under 35 U.S.C. §371 of published PCT Patent Application Number PCT/EP 2012/053526, filed Mar. 1, 2012 and claims priority to French Patent Application 1152285 filed Mar. 21, 2011, and published as WO2012/126706 on Sep. 27, 2012, the entire contents of which is hereby incorporated by reference herein.

TECHNICAL FIELD OF INVENTION

The invention relates to the liquid-proofing of a control panel suitable for use in motor vehicles and grouping together pushbuttons and knobs for the control of, for example, an audio system or of an air-conditioning system.

BACKGROUND OF INVENTION

All vehicles and many other systems are today fitted with control panels that group together the interfaces necessary for the user to control functions as various as the audio system, the air-conditioning, the telephone, or navigation.

In motor vehicles, these control panels are installed in the central console in a virtually vertical plane and are thus accessible to and manipulable by both the driver and the front-seat passenger. The controls are various and suited to the controlled function. In particular, pushbuttons, rotary knobs, and touch screens are provided. From a structural point of view, the control panels are a stack of distinct layers forming a unit. They are generally constructed from a base attached to a printed circuit covered with an elastomer sheet against which is placed a decorative fascia provided with the various interfaces. The printed circuit comprises electrical circuit-breakers switched (i.e.—opened and closed) by the actuation of the pushbuttons. After the fashion of computer keyboards, the elastomer sheet, often formed of silicone, protects the printed circuit from dusts and other external elements. It is in addition provided with deformable domes placed at the locations of the pushbuttons so that a dome applies a slight return force to a button opposed to the depression, the force causing the button to return to its initial position after having been depressed. In addition, the sheet is indented or provided with openings or other cut-outs that allow the passage of electroluminescent diodes as well as mechanical elements of a knob or of a button from the decorative fascia to the printed circuit. For reasons of modularity linked to the selection of vehicle options, the elastomer sheet can be formed of a plurality of partial sheets juxtaposed on the printed circuit.

Water is one of the most undesirable external elements. Whether the cause of this is rain on a convertible, morning dew, the vigorous washing of the inside of the car, or the cause is an accidentally spilled drink, it is imperative that each control panel is provided with protections ensuring that the printed circuit is sheltered and does not risk being reached by a liquid. The elastomer sheet provides this liquid-proofing function in particular by means of a peripheral barrier slightly compressed against the inside face of the decorative fascia. However, due to the ageing and the differential expansion of the materials, the plurality of the sheets, the various shapes or the multiple cut-outs make this liquid-proofing function difficult to form reliably. Taking all these constraints into account it is important to propose an effective system for protection against liquids that can be adapted to various decorative fascia configurations.

SUMMARY OF THE INVENTION

The present invention resolves the problem mentioned above by proposing the arrangement in accordance with claim 1 of a sheet that does not seek to necessarily prevent the entry of water into the control panel but provides for the evacuation of the liquid along safe paths thus protecting critical zones.

The invention proposes a control panel, particularly for a motor vehicle, and intended to be placed substantially in a vertical plane, the panel comprising the layered assembly of a flat base, of an elastomer sheet, and of a decorative fascia. The flat base also comprises detectors that can, for example, be electrical contacts and circuit-breakers or optical forks. The base can in particular be a printed circuit. The elastomer sheet, which can be formed of silicone, is mounted against the base. The sheet is provided with openings. The decorative fascia has its inside face facing the main surface of the sheet. The decorative fascia is also provided with control buttons such as pushbuttons or rotary knobs.

The base, the sheet, and the fascia are so arranged that the actuation of a control button is detected by a detector, for example detecting the switching of an electrical circuit-breaker.

The control panel is advantageously provided with a means for protection against liquids. This means is preferably made in one piece with the elastomer sheet and comprises elements projecting from the main surface of the sheet. The elements are so arranged that when the control panel is in the substantially vertical plane and a liquid penetrates between the sheet and the inside face of the decorative fascia, the liquid is guided along a determined course and re-emerges from the panel having avoided the critical zones leading in particular to the detectors.

The protection means comprises a plurality of linear elements with a slope relative to the vertical plane. Thus, in the vertical plane, the liquid flows from one element to the other, from the top of the panel toward the bottom of the panel, and emerges at an outlet situated at the bottom of the panel.

Certain elements of the protection means project sufficiently from the main surface of the sheet for their tops to be in contact with the inside surface of the decorative fascia. They thus form liquid-tight barriers protecting the critical zones.

Certain elements of the detection means project from the main surface of the sheet so that their tops are at a distance from the inside surface of the decorative fascia. They thus form guides that the liquid follows through capillarity to converge towards an outlet.

Certain elements of the protection means are formed recessed into the thickness of the sheet itself. They thus form channels with a slope relative to the vertical plane such that the liquid follows by capillarity to converge towards an outlet.

In addition, a zone of the main surface of the sheet can be perfectly smooth, of mirror polished type for example. This mirror zone encourages the flow of the liquid and prevents its stagnation. Thus, the mirror zone cooperates with the other elements of the protection means so as to evacuate or direct the liquid towards an outlet.

Also, a zone of the main surface of the sheet can be grained. This zone slows the flow of the liquid and thus prevents drops from arriving too quickly at elements of the protection means and possibly passing over the elements in a cascade effect. The grained zone thus cooperates with the other elements of the protection means so as to controllably evacuate the liquid towards an outlet.

In addition, the elastomer sheet can comprise a first partial sheet provided with a first part of the protection means and a second partial sheet provided with a second part of the protection means. The partial sheets are juxtaposed. The first and the second part of the protection means cooperate to evacuate the liquid penetrating the panel towards an outlet. The juxtaposed partial sheets join along a dividing line forming a slightly recessed channel relative to the main surfaces of the partial sheets. The channel has a slope relative to the vertical plane and cooperates with the elements of the protection means so as to evacuate or direct the liquid towards an outlet.

The protection means can in addition comprise linear elements projecting from the inside face of the decorative fascia. These elements of the inside face cooperate with the elements of the sheet so as to evacuate or direct the liquid towards an outlet.

The elastomer sheet can in addition be provided with deformable domes projecting from its main surface and so arranged that the actuation of a control button causes the elastic deformation of a dome thus generating a return force opposed to the actuation of the control button. After having been released, the button returns to its initial position.

BRIEF DESCRIPTION OF DRAWINGS

An embodiment of the invention is now described by means of the following figures.

DETAILED DESCRIPTION

Figure 1:
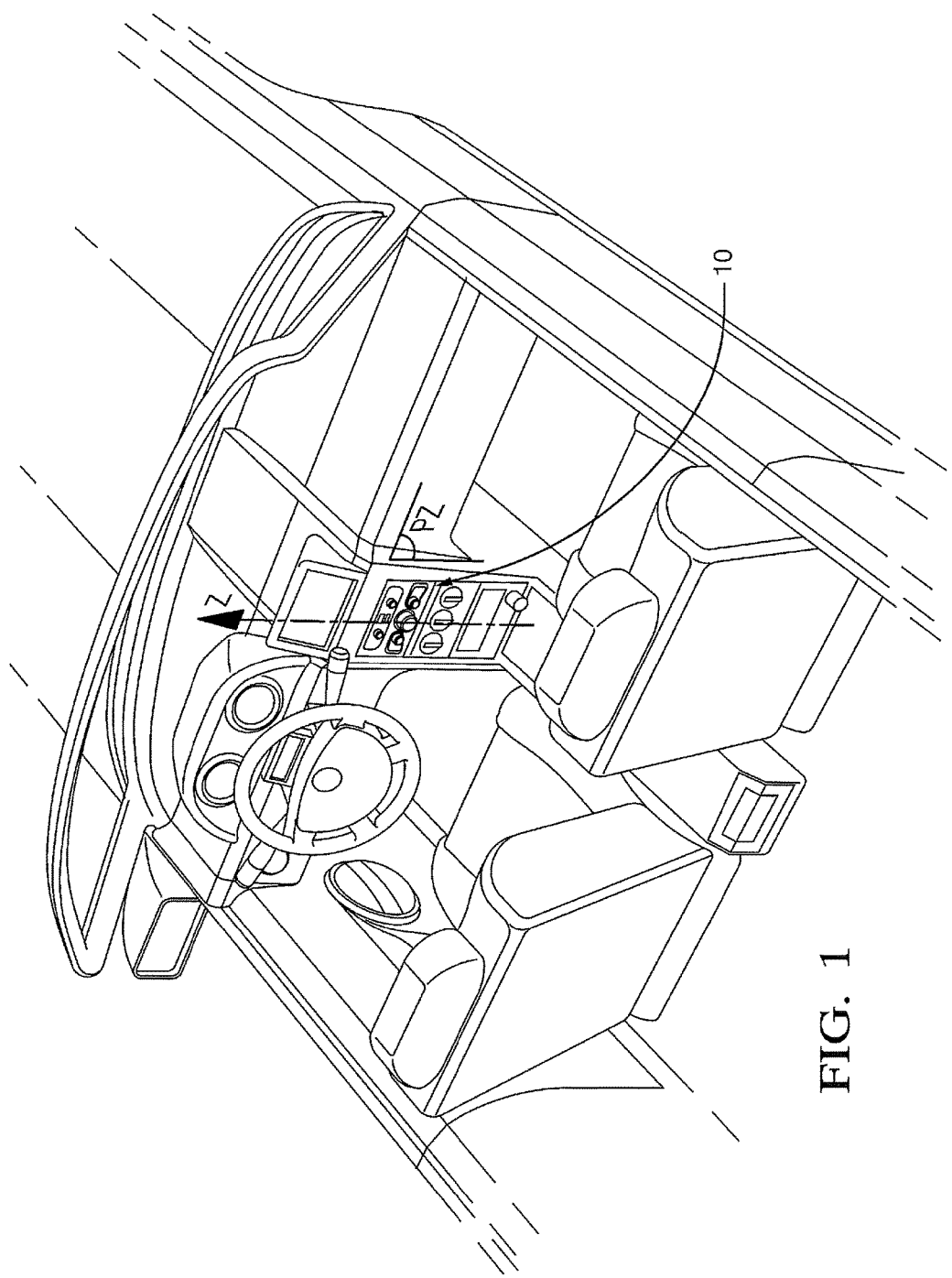
FIG. 1 is an overall view of the inside of a convertible in which a control panel in accordance with the invention is integrated in the vertical part in the central console.
Figure 2:
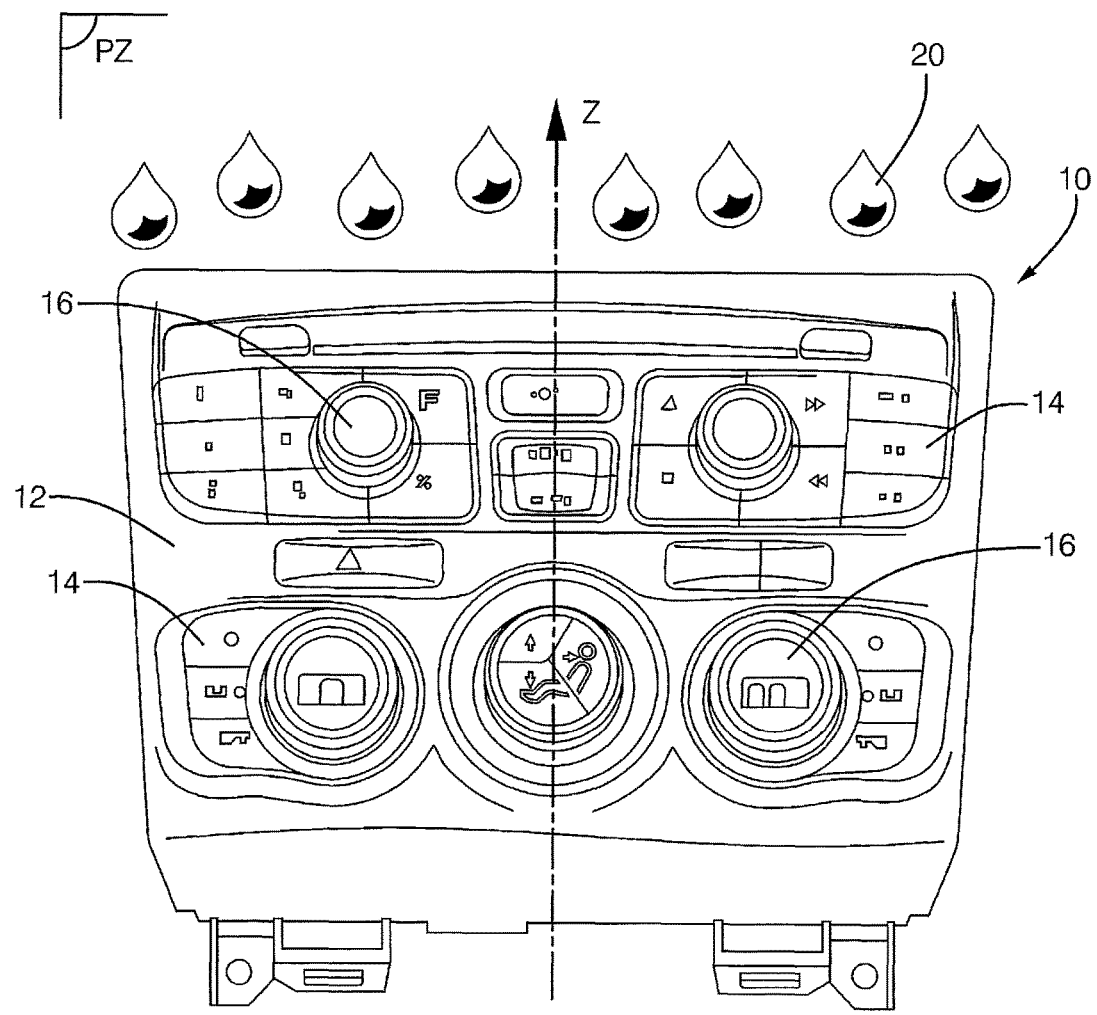
FIG. 2 is a frontal view of the control panel of FIG. 1 onto which a liquid is falling.

FIG. 1 shows a control panel 10, the object of the present invention, in a motor vehicle environment. Other environments, such as the train, the aircraft, the motorbike or any home automation apparatus having a control panel can also benefit from the advantages of the present invention. In FIGS. 1 and 2 the control panel is shown installed between the front seats of a convertible, substantially in a vertical plane PZ of the central console, which plane contains the vertical axis Z. The decorative fascia 12, the visible and accessible part of the control panel 10, groups together the interfaces for control of the air-conditioning, of the audio system, or of navigation, for example. These functions are mainly controlled by means of pushbuttons 14 and rotary knobs 16. Other control means, such as touch screens or toggle switches are contemplated. The natural vertical orientation from bottom to top, along the axis Z indicated in the figures will be used in this description.

FIG. 2 shows an example of a decorative fascia 12 provided with pushbuttons 14 and with three rotary knobs 16. As shown diagrammatically by the drops of water 20 above the control panel 10, the panel can be subject to bad weather, or even to any form of projection of liquid 20.

Figure 3:
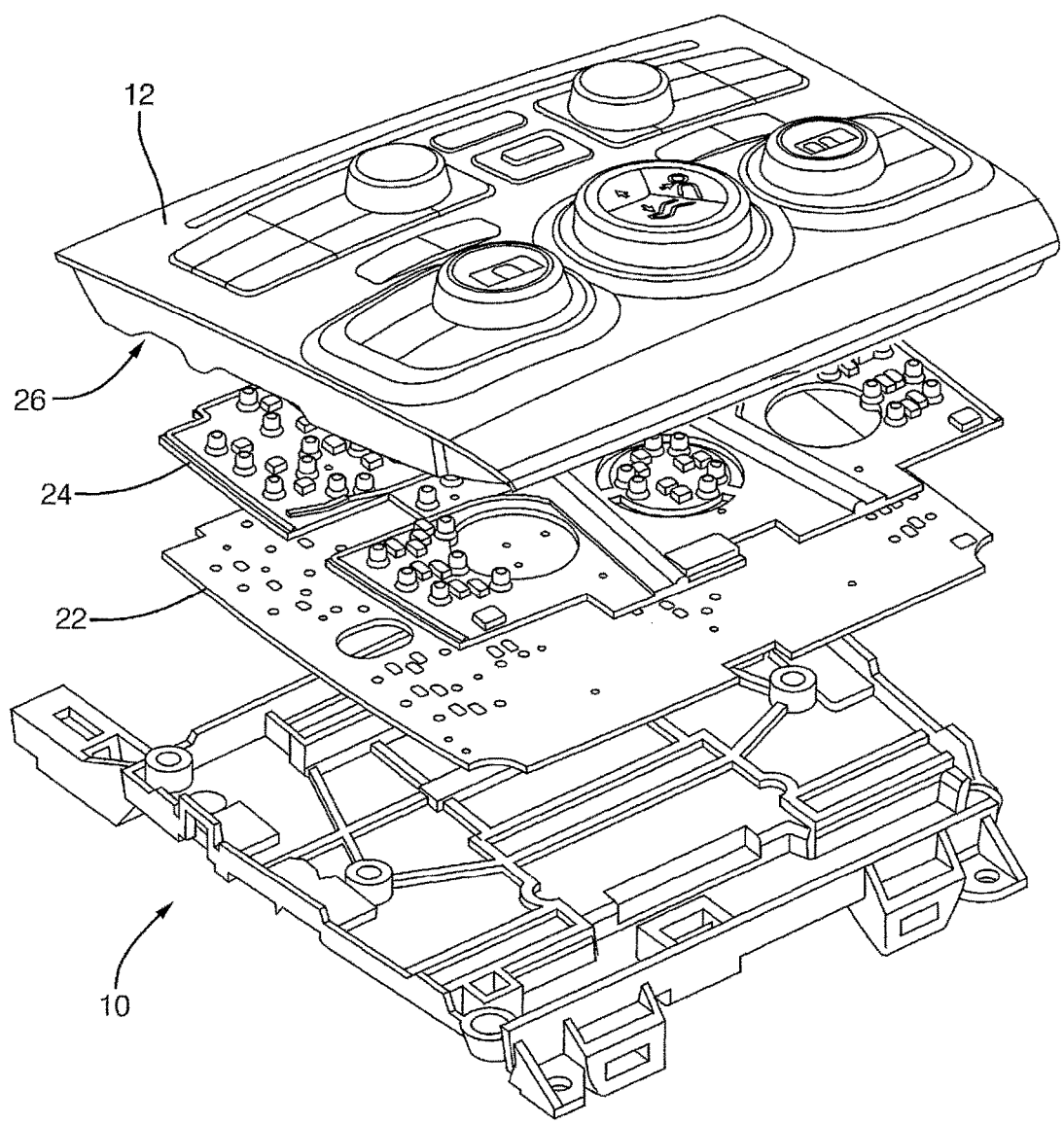
FIG. 3 is an exploded view of the assembly of a printed circuit, of an elastomer sheet and of a decorative fascia that are the main components of the control panel of FIGS. 1 and 2.

FIG. 3 presents certain components of the control panel 10 in an exploded view. A printed circuit (PCB) 22 is covered with an elastomer sheet 24, generally of silicone, on which is placed the decorative fascia 12.

The printed circuit 22 is provided with detectors that can be electrical circuit-breakers or optical forks. It is also provided with electronic components as well as the set of tracks providing their electrical interconnection and with electroluminescent diodes (LED) used for the back-lighting of certain parts of the fascia 12.

The decorative fascia 12 is the visible component of the panel 10. It includes an inside face 26 facing the elastomer sheet 24 and an outside face from which emerge the manipulable pushbuttons 14 and rotary knobs 16 actuation of which switches the circuit-breakers of the printed circuit 22.

The elastomer sheet 24 placed between the printed circuit 22 and the inside face 26 of the decorative fascia 12 covers the printed circuit 22. It is provided with openings necessary for the passage of spindles and other mechanical parts forming in particular rotary knobs 16 or other detectors such as optical forks. The sheet 24 is also provided with openings at the locations of the LED or other light sources used for the back-lighting of screens as well as with elastically deformable domes 30 placed at the locations of the circuit-breakers and of the pushbuttons 14. Under each dome, a chip of electrically conductive material ensures the switching of the circuit breaker on depression of a dome. Due to the elasticity of the domes a button 14 returns by itself and automatically to its original position, after having been pushed.

When the panel 10 is assembled, the inside face 26 of the decorative fascia 12 is at an interface distance from the main face 32 of the sheet 24.

Figure 4:
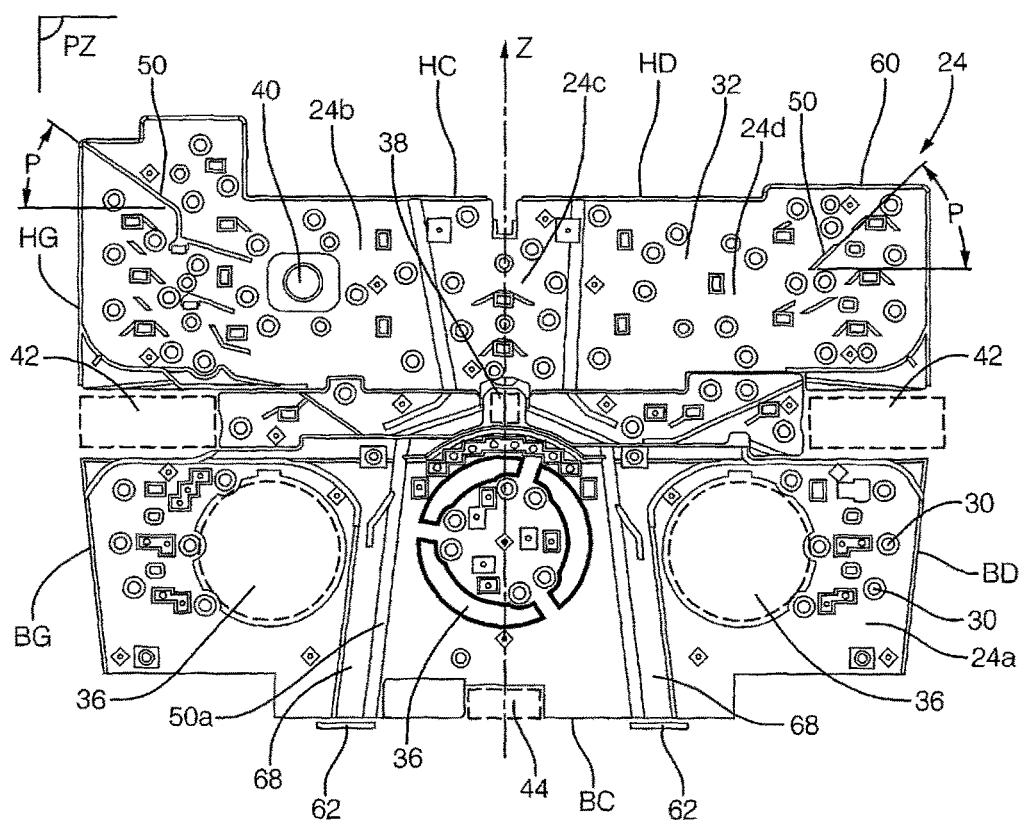
FIG. 4 is a frontal view of the main surface of the elastomer sheet of the control panel of FIGS. 1 to 3.

FIG. 4 shows in detail the elastomer sheet 24 made in accordance with the invention. The sheet 24 is presented from the view of its main face 32 that is facing the inside face 26 of the decorative fascia 12. The sheet 24 is approximately rectangular. In the lower half of the sheet 24 are seen three horizontally aligned circular openings 36. They correspond to the passages of three rotary knobs 16 that can in particular allow regulation of the air-conditioning: direction, force, and temperature of the air-flow. In addition a square opening 38 and another circular one 40 of smaller sizes than the three preceding ones are respectively formed at the center and at the top left of the sheet 24. Lastly, none of the four upper, lower, right, and left edges is perfectly rectilinear and each presents cut-outs and notches. In particular, two lateral rectangular cut-outs 42 are formed symmetrically in the right edge and in the left edge and a lower cut-out 44 that is also rectangular and is formed at the center of the lower edge.

In the example of sheet 24 of FIG. 4, the circular openings 36, the lateral cut-outs 42, the lower cut-out 44 and the small central cut-out 38 are examples of critical zones that must imperatively be protected from the entry of liquid 20. In FIG. 4, these zones are surrounded by a peripheral broken line. The sheet 24 is of substantially uniform thickness and the domes 30 extend from the main surface 32 towards the decorative fascia 12.

The sheet 24 shown in the figures and briefly described above is only a non-limiting example of the support of the invention. Sheets 24 can be of any shape, they can be larger or smaller, they can be provided with a different number of openings and indentations of any shape. They can be symmetrical like the example of the figures or non-symmetrical.

The sheet 24 is provided with a means 50 for protection against liquids 20. The means 50 comprises barriers 52, ribs 54, and channels 56 that cooperate with each other, in the manner similar to a funnel, to conduct or direct the least droplet from its entry at any point on the upper edge 60 towards a lower outlet 62. The liquid 20 is diverted progressively with its descent so as to avoid the critical zones 36, 38, 42, 44.

The barriers 52 and the ribs 54 are linear elements projecting relative to the main surface 32 of the sheet 24 while the channels 56 are linear elements recessed relative to the main surface 32 of the sheet 24. Observed individually in the vertical plane PZ, in accordance with FIG. 4, and more particularly in the enlarged zone, these guiding elements have a slope p along which the liquid 20 naturally flows.

Figure 5:
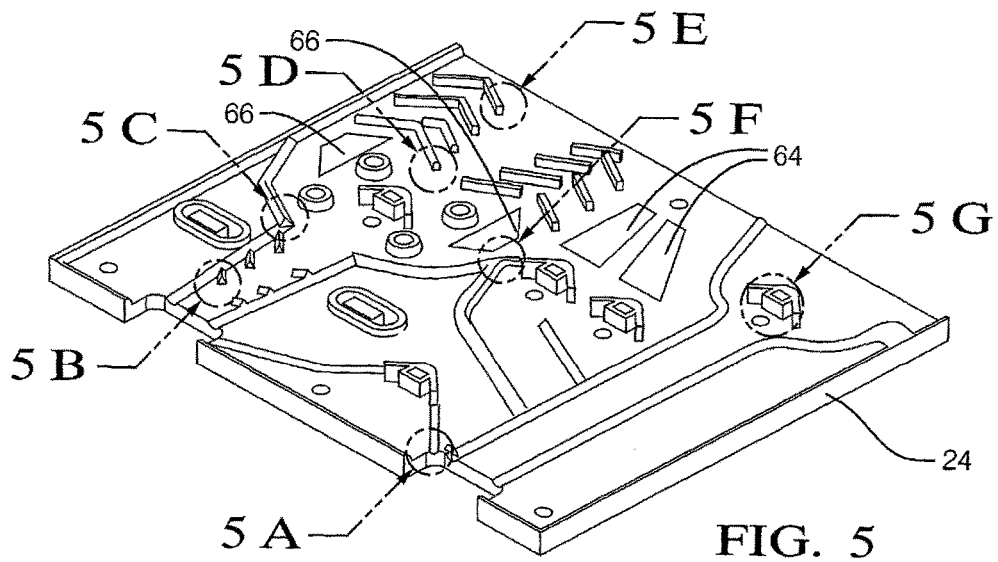
FIG. 5 is a catalogue view showing different elements that can be used on a sheet to ensure the liquid-tightness of a control panel. These different elements are individually enlarged in FIGS. 5A, 5B, 5C, 5D, 5E, 5F and 5G.
Figure 5A:
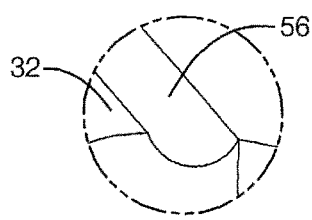
Figure 5B:
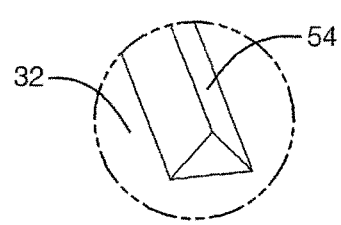
Figure 5C:
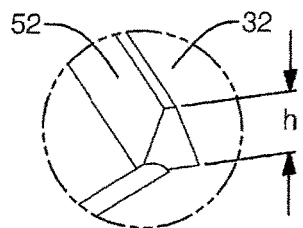
Figure 5D:
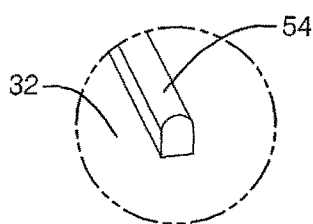
Figure 5E:
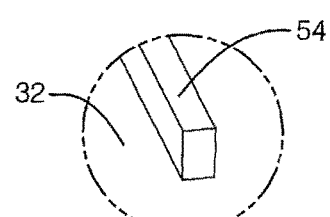
Figure 5F:
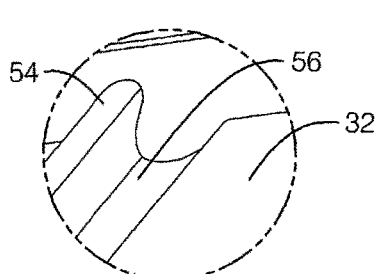
Figure 5G:
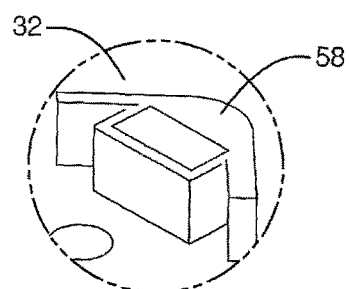

FIG. 5 and the associated FIGS. 5A, 5B, 5C, 5D, 5E, 5F, and 5G show, from a second sheet 24, a non-limiting catalogue of different elements of the means 50 for protection against liquids 20. The liquid 20 can be guided by means of barriers 52 (FIG. 5C) known as compression barriers. These barriers 52 rise relative to the main surface 32 of the sheet 24 by a height h greater than the interface distance and thus have their tops in contact and slightly compressed against the inside face 26 of the decorative fascia 12 when the panel 10 is assembled. The ribs 54 (FIG. 5B, 5D, 5E) are less high than the barriers 52 and do not contact the inside face 26 of the decorative fascia 12. They can in particular be of triangular (FIG. 5B), rectangular (FIG. 5E), or rounded (FIG. 5D) section as required and depending on the configuration of the panel 10. FIG. 5 also shows the channels 56 (FIG. 5A) formed recessed into the thickness of the sheet 24 itself and having half-round sections, although other sections, square or triangular, are possible. A rib 56 can in addition be associated with a channel 54 so as to form a double protection (FIG. 5F). Lastly, in order to very locally protect a location, such as a corridor for an LED, a small rib 58 (FIG. 5G) in the form of a roof with two sides is placed over the location to be protected.

Associated with the barriers 52, with the ribs 54, 58, and with the channels 56, the flow of the liquid 20 towards an outlet 62 can be orientated and encouraged by particular surface states in certain zones of the sheet 24. Thus, in FIG. 5 and only by way of illustration, are shown two zones 64 the surfaces of which are perfectly smooth, of mirror polished type, and two zones 66 the surfaces of which are grained. The flow is facilitated in the mirror zones 64 and thus the stagnation of the liquid 20 is prevented. In the grained zones 66, the flow is on the contrary slowed which permits the avoidance of large drops 20 arriving too quickly at the ribs 54, 58, or the channels 56 and passing over which would cause a cascade effect incompatible with the precise guiding of the flow.

The sheet of FIG. 4 is rectangular and symmetrically divided into six zones themselves virtually rectangular. Three upper zones: left HG, central HC and right HD, are situated just above three lower zones: left BG, central BC and right BD. The dividing lines between these zones are formed by compression barriers 52 extending in a straight line. In addition vertical barriers 52 extending from side to side of the central zone BC define two outlet corridors 68.

The upper zones HG, HC, HD all have a slight opening in the barrier 52 forming their lower dividing line and, at this position, each barrier 52 adopts a slight slope p so as to create a funnel discharging into the outlet corridors 68. Similarly, the barrier 52 situated between the upper HC and lower BC central zones is in the form of a chevron and guides the liquid 20 from the upper central zone HC towards the outlet corridors 68. The sheet 24 being thus partitioned, a liquid 20 that has entered one of the three upper zones HG, HC, HD, leaves naturally through the outlet corridors 68. The critical zones 36, 38, 42, 44, identified above, are protected. In addition barriers 52, ribs 54, and channels 56 are placed in the three upper zones HG, HC, HD. Each of these elements has a slope p that orientates the liquid 20 from its entry towards the outlet corridors 68. Due to these additional elements the liquid 20 does not accumulate at the bottom of the upper zones HG, HC, HD, but quickly converges towards an outlet 62.

Figure 6:
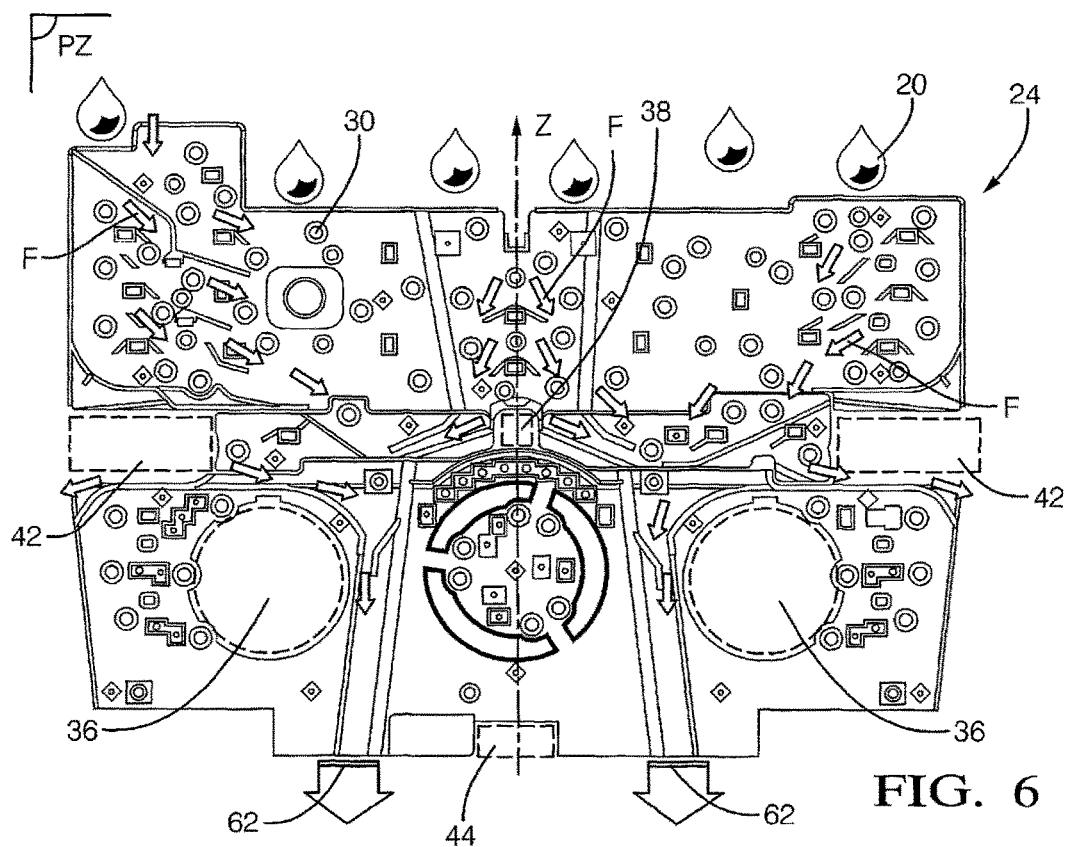
FIG. 6 is a view of the sheet of FIG. 4 in which the route of the flow of liquid is indicated by arrows.

FIG. 6 indicates with arrows F various flow paths taken by a liquid 20 having entered at the top of the panel 10 and having been led by the barriers 52, the ribs 54, 58 and the channels 56 towards the outlet 62 situated below.

In an alternative construction and in order to satisfy the numerous requirements of different options with which vehicles may be provided, the sheet 24 can be formed by juxtaposition of a plurality of partial sheets. For example, partial sheets can be prepared to accord with different air-conditioning control systems and other partial sheets formed to accord with different audio systems. The partial sheets corresponding to the customer's choice will then be selected and juxtaposed at assembly.

Thus, in FIG. 4 the lower zones BG, BC, BD can form part of a first partial sheet 24a, while the three upper zones HG, HC, HD can form three other distinct partial sheets 24b, 24c, 24d. Each partial sheet 24a-24d is provided with a part 50a-50d of the protection means 50. The four partial sheets 24a-24d are then juxtaposed contiguously to cover the printed circuit 22 and thus the parts 50a-50d of the protection means 50 are completed to together evacuate the liquid 20. The dividing line between two partial sheets 24a, 24b forms a channel 56 with a slope p and is one of the elements of the protection means 50.

Figure 7:
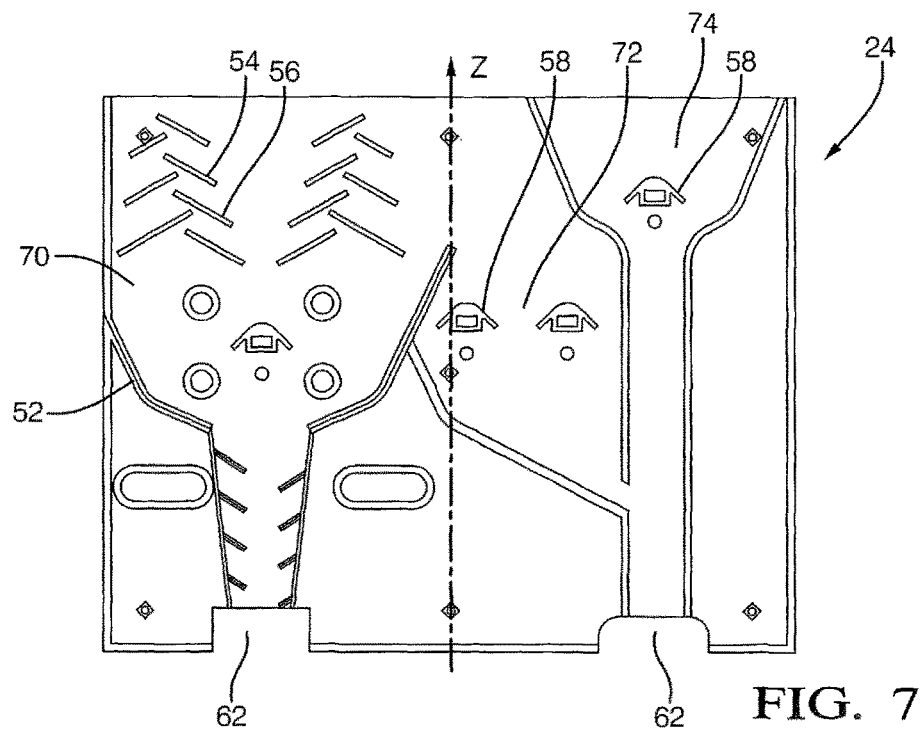
FIG. 7 is a plan view of a second elastomer sheet made in accordance with the invention.

Another sheet 24 made in accordance with a similar principle to the first sheet is shown in FIG. 7. The barriers 52, the ribs 54 and the channels 56 of this other sheet, also rectangular, form a left funnel 70, a central passage 72 and a right funnel 74. The left funnel 70 in its upper part comprises two banks of ribs 54, each bank forming a breakwater. Under the ribs 54, four domes 30 are placed in a rectangle at the center of which a rectangular critical zone intended for the passage of an LED is protected by a rib 58 forming a roof with two sides. The upper part of this left funnel 70 leads to an outlet corridor 68 that is also rectilinear and provided with ribs 54 guiding the liquid towards the corridor center 68.

The right funnel 74 comprises an upper part, of smaller dimensions than those of the left funnel 70, and a rectilinear outlet corridor 68 having no ribs. At the center of its upper part, this straight funnel 74 comprises another LED passage also protected by a rib 58 forming a roof with two sides.

Between the left 70 and right 74 funnels is a central passage 72 in which two new LED passages are also each protected by a rib 58 forming a roof with two sides. The central passage 72 is also defined in its lower part by a barrier 52 with a double slope leading towards the right outlet duct 68 via an opening formed in one of the barriers 52 defining this outlet duct 68.

In the preferred embodiment described above, the elastomer sheet 24 is molded and the means 50 for protection against liquids is integrated in it. In complementary manner, ribs can be provided projecting from the inside face 26 formed in one piece with the decorative fascia 12. On assembly of the control panel 10, ribs 54 of the sheet 24 enter into contact and then cooperate with ribs of the inside face 26, thus together forming liquid-tight barriers impassable by a liquid 20.

The invention claimed is:

1. A control panel configured to be placed in a substantially vertical plane, the panel comprising:
 a flat base that includes detectors;
 an elastomer sheet mounted against the base, wherein the sheet defines openings through the sheet; and
 a decorative fascia configured to define an inside face that faces a main surface of the sheet, wherein the decorative fascia is provided with control buttons in communication with the detectors via the openings, wherein
 the base, the sheet, and the fascia are arranged such that the actuation of a control button causes a detection by at least one of the detectors; wherein
 the control panel is in addition provided with a protection means formed of elements arranged such that when a liquid penetrates between the sheet and the inside face of the decorative fascia, the liquid is guided along a determined course and re-emerges from the panel having avoided critical zones leading to the detectors, wherein
 the protection means includes a plurality of linear elements with a slope relative to the vertical plane such that the liquid flows from one element to another from the top of the panel and converges at an outlet situated at the bottom of the panel.

2. A control panel as described in claim 1, wherein elements of the protection means project sufficiently from the main surface of the sheet so that tops of the elements are in contact with the inside surface of the decorative fascia so as to form liquid-tight barriers protecting critical zones.

3. A control panel as described in claim 1, wherein elements of the protection means project from the main surface of the sheet so that tops of the elements are at a distance from the inside surface of the decorative fascia to form guides which the liquid follows by capillarity to converge towards an outlet.

4. A control panel as described claim 1, wherein elements of the protection means includes recesses into the sheet to form channels with a slope relative to the vertical plane, such that the liquid follows these channels by capillarity to converge towards an outlet.

5. A control panel as described in claim 1, wherein a zone of the main surface of the sheet includes a mirror zone configured to guide liquid towards an outlet.

6. A control panel as described in claim 1, wherein a zone of the main surface of the sheet is grained to slow the flow of the liquid in order to prevent liquid from arriving too quickly at elements of the protection means and passing over the protection means in a cascade effect, wherein the grained zone cooperates with the other elements of the protection means to guide the liquid towards an outlet.

7. A control panel as described in claim 1, wherein the elastomer sheet comprises a first partial sheet provided with a first part of the protection means and a second partial sheet provided with a second part of the protection means, the partial sheets being juxtaposed, the first and the second part of the protection means configured to cooperate to guide the liquid penetrating into the panel towards an outlet.

8. A control panel as described in claim 7, wherein the juxtaposed partial sheets join along a dividing line to form a recessed channel relative to the main surfaces of the partial sheets, the channel having a slope in the vertical plane and cooperating with the elements of the protection means so as to guide the liquid towards an outlet.

9. A control panel as described in claim 1, wherein the protection means comprises linear elements projecting from the inside face of the decorative fascia, wherein the elements of the inside face cooperate with elements of the sheet to guide the liquid towards an outlet.

10. A control panel as described in claim 1, wherein the sheet includes deformable domes projecting at the main surface of the sheet, the domes being so arranged that the actuation of a control button causes the elastic deformation of a dome generating a return force opposed to the actuation of the control button, the button returning to its initial position after having been released.

* * * * *